(12) United States Patent
Sakuma et al.

(10) Patent No.: US 6,332,922 B1
(45) Date of Patent: Dec. 25, 2001

(54) MANUFACTURING METHOD FOR CALCIUM FLUORIDE AND CALCIUM FLUORIDE FOR PHOTOLITHOGRAPHY

(75) Inventors: Shigeru Sakuma, Chigasaki; Tsutomu Mizugaki, Matsudo; Kazuo Kimura, Machida; Shuuichi Takano, Inagi, all of (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/257,296

(22) Filed: Feb. 25, 1999

(30) Foreign Application Priority Data

Feb. 26, 1998 (JP) .................................................. 10-045541
Feb. 27, 1998 (JP) .................................................. 10-046481

(51) Int. Cl.[7] .................................................. C30B 33/06
(52) U.S. Cl. .................................. 117/3; 117/937; 117/940
(58) Field of Search ............................. 501/40; 423/490; 75/10.55; 359/355; 117/3, 940, 937

(56) References Cited

U.S. PATENT DOCUMENTS

| 5,776,219 | * | 7/1998 | Jinbo et al. | 65/31 |
| 5,911,858 | * | 6/1999 | Ruffner | 204/192.27 |
| 6,061,174 | * | 7/1998 | Shiozawa et al. | 359/361 |

FOREIGN PATENT DOCUMENTS

| 213514 A | * | 9/1984 | (DE). |
| 8-005801 A | | 1/1996 | (JP). |

* cited by examiner

*Primary Examiner*—Felisa Hiteshew
*Assistant Examiner*—Binh X. Tran

(74) *Attorney, Agent, or Firm*—Morgan, Lewis & Bockius LLP

(57) ABSTRACT

A manufacturing method for a single crystal of calcium fluoride by which it is possible to obtain a single crystal of calcium fluoride with adequately small double refraction, which can be used in optical systems for photolithography, and in particular, a single crystal of calcium fluoride with a large diameter (ø 200 mm or larger) having superior optical properties, which can be used for photolithography with a wavelength of 250 nm or less. A manufacturing method for a single crystal of calcium fluoride, having its optical properties improved through an annealing process in which a single crystal of calcium fluoride is contained in a sealable container, and said container is sealed and vacuumed, followed by, a process of heating with a heater arranged external to said container so that the temperature inside said container is raised to a first temperature, which is lower than the melting point of said single crystal of calcium fluoride, a process by which the temperature inside said container is maintained at said first temperature for a designated period of time, and a process by which the temperature inside said container is lowered to room temperature, wherein, the maximum temperature of the annealing process is set to be a first temperature within the range of 1020 to 1150° C. Also provided is a manufacturing method for a single crystal of calcium fluoride having its optical properties improved through an annealing process such that, its maximum temperature during the thermal process is set to a first temperature which is within the range of 1020 to 1150° C., and which is maintained for a designated period of time, and its cooling speed for reaching a second temperature, which is in the range of (or around) 600 to 800° C., from said first temperature is set to be 1.2° C./hour or less, or its cooling speed for reaching a second temperature, which is in the range of (or around) 700 to 900° C., from said first temperature is set to be 1.2° C./hour or less.

12 Claims, 6 Drawing Sheets

MANUFACTURING METHOD FOR CALCIUM FLUORIDE AND CALCIUM FLUORIDE FOR PHOTOLITHOGRAPHY

This application claims the benefit of Japanese Application No. 10-046481 filed Feb. 27, 1998, and Japanese Application No. 10-045541 filed Feb. 26, 1998, which are hereby incorporated by reference.

BACKGROUND OF THE INVENTION

1. Field of the Invention

The present invention relates to a manufacturing method for a single crystal of calcium fluoride with a large diameter (ø 200 mm or greater) and superior optical properties, which can be used appropriately in an optical system as the lens and windows of various devices using KrF, ArF excimer lasers and $F_2$ lasers (such as a stepper, CVD device, or nuclear fusion device), and in particular, for photolithographic devices with a wavelength of 250 nm or less (such as photolithographic devices that utilize KrF, ArF excimer lasers and $F_2$ lasers), and a single crystal of calcium fluoride for photolithography (a wavelength of 200 nm or less).

2. Discussion of the Related Art

Currently, VLSI has been experiencing increasingly higher integration and higher functionalization. In the field of theoretical VLSI progress is being made on a "system on a chip" in which larger systems are loaded on a chip. Along with this, microscopic processes and higher integration have been required for wafers, for example of silicon, which is the substrate. In photolithography, in which microscopic patterns of integrated circuits are exposed and transcribed on a wafer, for example of silicon, an exposing device called a stepper has been used.

Using DRAM as an example of VLSI, recently, a capacity of 256 M or more has been realized and the width of the processed line has become very small (0.35 μm or less). Therefore, the projection lens of the stepper, which is the key to photolithographic technology, requires superior image formation performance (resolution, focal depth).

The resolution and focal depth are determined by the wavelength of the light used for the exposure and the numerical aperture (NA) of the lens. When the exposure wavelength λ is the same, smaller patterns have a larger angle of diffracting light, and therefore, unless the NA of the lens is large, the diffracting light cannot enter. In addition, the shorter the exposing wavelength λ, the smaller the angle of the diffracting light, and therefore, a small NA for the lens is acceptable.

The resolution and the focal depth are expressed in the following formulas:

Resolution=k1*λ/NA, and

Focal depth=k2*λ/(NA)² where k1 and k2 are proportional constants.

From the formulas above, it is understood that in order to improve the resolution, it is desirable to increase the NA of the lens (to enlarge the diameter of the lens) or to shorten the exposure wavelength λ. Shortening λ is more advantageous from the point of view of the focal depth.

First, the shortening of the wavelength of light is described. The exposure wavelength λ has continued to become shorter, and steppers that use KrF excimer laser light (wavelength of 248 nm) as the light source have appeared on the market. There are very few optical materials that can be used for photolithography in the short wavelength range of 250 nm or less. There have been two kinds of materials, calcium fluoride and silica glass that have been used.

Next, the enlargement of the diameter of the lens is described. Simply having a large diameter is not enough. A silica glass or a single crystal of calcium fluoride with superior optical properties, such as uniformity of the refractive index, is required. Here, an example of a manufacturing method for a single crystal of calcium fluoride from the prior art is described. A single crystal of calcium fluoride has been manufactured through the Bridgeman method (Stockburger method, crucible lowering method). In the case of a single crystal of calcium fluoride used in the range of ultraviolet or vacuum ultraviolet light, natural calcium fluoride is not used as the material. In general, a high-purity material produced through chemical synthesis is used. Although it is possible to use powdered material, in this case, there is significant mass reduction during fusing, and therefore, normally, half-fused products or the crushed form are used.

First, a crucible filled with said material is placed in a growth device. Then, the inside of the growth device is maintained with a vacuumed atmosphere of $10^{-3}$ to $10^{-4}$ Pa. Next, the temperature inside the growth device is raised to the melting point of the calcium fluoride or higher, and the material inside the crucible is fused. At this point, in order to prevent temporal changes of the temperature inside the growth device, the temperature is controlled by a constant electrical output or a high-precision PID control.

At the stage of crystal growth, gradual crystallization occurs from the bottom of the crucible by lowering the crucible at a speed of 0.1 to 5 mm/h. The crystal growth is finished at the point when it is crystalized to the top portion of the fused liquid. Then, it undergoes simple and gradual cooling, avoiding sudden cooling, so that the grown crystal (ingot) will not be cracked. When the temperature inside the growth device is reduced to room temperature, the device is released to the normal atmosphere and the ingot is removed.

In the case of calcium fluoride for small-sized optical parts and windows where uniformity is not required, after the ingot is cut out, it is processed to the final product via a process such as rounding. In the case of a single crystal of calcium fluoride used in, for example, the projection lens of a stepper, which requires high uniformity, simple annealing is applied to the ingot. Then, after it is cut and processed to the appropriate size for the product with a given purpose, further annealing is applied.

In Patent Publication Tokukai Heisei 8 (1996)-5801, there is a disclosure of calcium fluoride for photolithography in which the optical path difference due to double refraction in either direction of the 3 axes is 10 nm/cm, when it is used in the specific wavelength band of 350 nm or less. The influence that the optical path difference imparts to the imaging performance of the optical system is expressed as a numerical value which is the multiple of the wavelength (such as λ/10), and the smaller the coefficient, the smaller the influence.

For example, with an optical path difference of 10 nm, when the wavelength λ=248 nm, the optical path difference becomes 10/248=0.040λ, and when λ=193 nm, the optical path difference becomes 10/193=0.052λ. In other words, even with the same optical path difference of 10 nm, the result is that a λ of 193 nm has a greater effect and the imaging performance becomes worse. Therefore, for the projection lens of a stepper that be used with the next generation ArF excimer laser (wavelength of 193 nm), an optical path difference of 10 nm/cm is not adequate enough. Thus, calcium fluoride with an even smaller optical path difference due to double refraction is required.

Hereinafter, the optical path difference per unit length due to double refraction is simply called double refraction. Also, in general, this double refraction is often called strain. This is because even if there is no double refraction in the material itself, double refraction is often generated due to strains.

As described above, calcium fluoride is manufactured through the Bridgeman method. After calcium fluoride is grown through the Bridgeman method, the calcium fluoride is gradually cooled at a rate at which it will not crack (or to the extent that cutting is possible) and then it is taken out as an ingot. Sometimes, an ingot is directly cut to size for a given purpose, however, the greater the mass, the greater the double refraction and the nonuniformity of the refraction, index. Therefore, said ingot is cut into multiple blocks and then goes through a further annealing process so that the quality is improved.

From the point of view of productivity, in general, the period of this annealing process has, in the past, been one to two weeks. Therefore, the cooling speed during the cooling stage, which takes a large percentage of the time of the entire annealing process, has been set to be 10 to 5° C./hour. However, a single crystal of calcium fluoride obtained through this type of annealing (thermal process) for a single crystal of calcium fluoride has problems in that the refractive index has poor uniformity and the double refraction is too large. Therefore, it is difficult to obtain a single crystal of calcium fluoride that can be used in an optical system for photolithography. In particular, the problem existed in which a single crystal of calcium fluoride with a large diameter (ø 200 mm or greater) that could be used for photolithography with at wavelength of 250 nm or less could not be obtained.

Accordingly, the present invention is directed to a manufacturing method for calcium fluoride and calcium fluoride that substantially obviates one or more of the problems due to the limitations and disadvantages of the related art.

SUMMARY OF THE INVENTION

An objective of the present invention is to provide a manufacturing method for a single crystal of calcium fluoride, which makes it possible to obtain a single crystal of calcium fluoride with a superior uniform refractive index and sufficiently small double refraction that can be used for the optical systems in photolithography, and in particular a large diameter (ø 200 mm or greater) single crystal of calcium fluoride with superior optical properties that can be used for photolithography with a wavelength of 250 nm or less by applying an annealing process to the single crystal of calcium fluoride.

Another objective of the present invention is not only to obtain a large diameter (ø 200 mm or greater) single crystal of calcium fluoride with superior optical properties as described above, but also, to provide a manufacturing method for a single crystal of calcium fluoride in which the above-mentioned effect and productivity can be well-balanced.

In addition, another objective of the present invention is to provide a single crystal of calcium fluoride for photolithography (wavelength of 200 nm or less).

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, in one aspect of the present invention there is provided a manufacturing method for a single crystal of calcium fluoride, having its optical properties improved through an annealing process comprising the steps of providing a single crystal of calcium fluoride in a sealable container, sealing the container with a vacuum, then heating the container with a heater arranged external to the container such that a temperature inside the container is raised to a first temperature, which is lower than a melting point of the single crystal of calcium fluoride, maintaining the temperature inside the container at the first temperature for a designated period of time, lowering the temperature inside the container to room temperature, wherein, the first temperature is between 1020° C. to 1150° C.

In another aspect of the present invention, there is provided a manufacturing method for a single crystal of calcium fluoride having its optical properties improved comprising the steps of providing a single crystal of calcium fluoride and a fluorination agent in a second container arranged in a sealable first container, sealing the first container with a vacuum, then heating the first container with a heater arranged external to the first container such that a temperature inside the second container is raised to a first temperature, which is lower than a melting point of the single crystal of calcium fluoride, while the second container is filled with a fluorine gas atmosphere, maintaining the temperature inside the second container at the first temperature for a designated period of time, lowering the temperature inside the first container and the temperature inside the second container to room temperature, opening the inside of the first container to a normal atmosphere, wherein, the first temperature is between 1020° C. and 1150° C.

In another aspect of the present invention, there is provided a manufacturing method for a single crystal of calcium fluoride, having its optical properties improved comprising the steps of providing a single crystal of calcium fluoride in a sealable container, sealing the container with a vacuum, then heating the container with a heater arranged external to the container such that a temperature inside the container is raised to a first temperature, which is lower than a melting point of the single crystal of calcium fluoride, maintaining the temperature inside the container at the first temperature for a designated period of time, lowering the temperature inside the container to room temperature, wherein, the container is filled with an inert gas, and the inside of the container is maintained at an atmosphere of approximately 1 atm such that the single crystal of calcium fluoride is not oxidized.

In another aspect of the present invention, there is provided a manufacturing method for a single crystal of calcium fluoride having its optical properties improved comprising the steps of providing a single crystal of calcium fluoride and a fluorination agent in a second container arranged in a sealable first container, sealing the first container with a vacuum, then heating the first container with a heater arranged external to the first container such that the temperature inside the second container is raised to a first temperature, which is lower than a melting point of the single crystal of calcium fluoride, while the second container is filled with a fluorine gas atmosphere, maintaining the temperature inside the second container at the first temperature for a designated period of time, lowering the temperature inside the second container to room temperature, and opening the inside of the first container to a normal atmosphere, wherein, at a minimum, in order to prevent oxidation of the single crystal of calcium fluoride during the process, the process is carried out such that the fluorination agent is vaporized and becomes a fluorine gas atmosphere inside of the second container, while a pressure inside the first container is maintained at approximately 1 atm.

In another aspect of the present invention, there is provided a manufacturing method for a single crystal of calcium fluoride, having its optical properties improved comprising the steps of providing a single crystal of calcium fluoride in a sealable container, sealing the container with a vacuum, then heating the container with a heater arranged external to the container such that a temperature inside the container is raised to a first temperature, which is lower than a melting point of the single crystal of calcium fluoride, maintaining the temperature inside the container at the first temperature for a designated period of time, lowering the temperature inside the container to room temperature, wherein, the first temperature, which is between 1020° C. and 1150° C., is lowered to a second temperature, which is in the range of around 600° C. to 900° C., at a rate of 1.2° C./hour or less.

In another aspect of the present invention, there is provided a single crystal of calcium fluoride for photolithography, having a wavelength of 250 nm or less, with a diameter of ø 200 mm or greater, with a double refraction value, in the direction of the axis of light, that is 2 nm/cm or less.

It is to be understood that both the foregoing general description and the following detailed description are exemplary and explanatory and are intended to provide further explanation of the invention.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Figure 1:
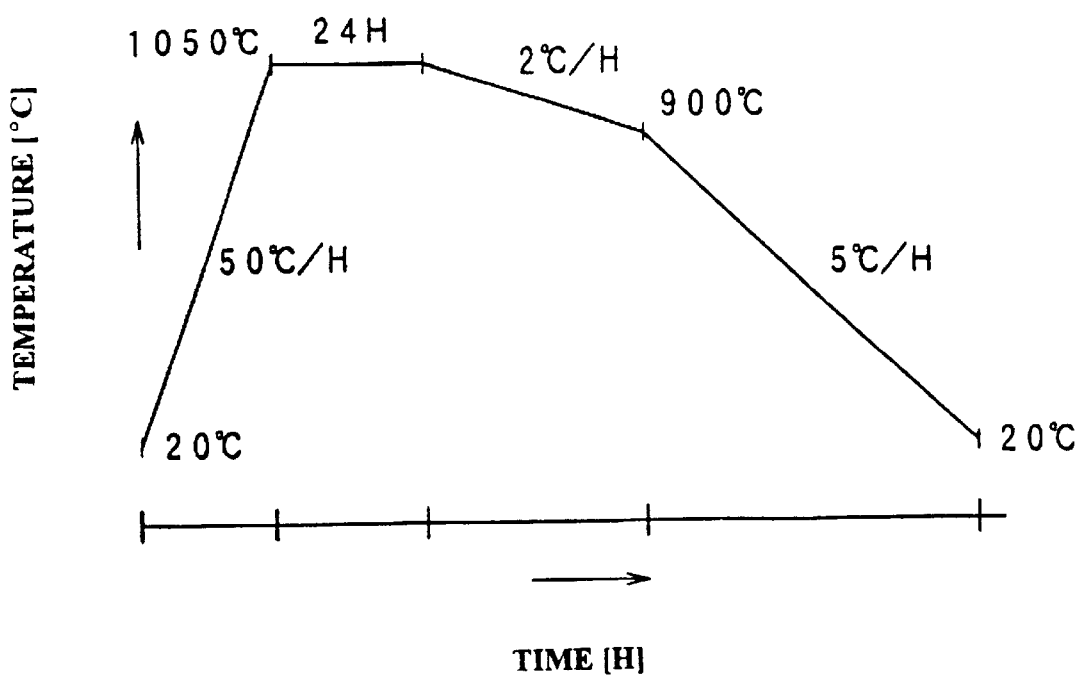
FIG. 1 is a temporal graph that shows the schedule of the annealing process in the first preferred embodiment.

The present invention provides a manufacturing method for a single crystal of calcium fluoride, having its optical properties improved through an annealing process in which a single crystal of calcium fluoride is contained in a sealable container, and the container is sealed and vacuumed, followed by, a process of heating with a heater arranged external to the container so that the temperature inside the container is raised to a first temperature, which is lower than the melting point of the single crystal of calcium fluoride, a process by which the temperature inside the container is maintained at the first temperature for a designated period of time, and a process by which the temperature inside the container is lowered to room temperature, wherein, the maximum temperature of the annealing process is set to be a first temperature within the range of 1020° C. to 1150° C.

The invention also provides a manufacturing method for a single crystal of calcium fluoride having its optical properties improved through an annealing process in which a second container containing a single crystal of calcium fluoride and a fluorination agent is arranged in a sealable first container, the first container is sealed, and the inside of the first container is vacuumed, followed by, a process in which, by heating with a heater arranged external to the first container, the temperature inside the first container and/or the temperature inside the second container is raised to a first temperature, which is lower than the melting point of the single crystal of calcium fluoride, while the second container is filled with a fluorine gas atmosphere, a process in which the temperature inside the first container and/or the temperature inside the second container is maintained at the first temperature for a designated period of time, a process in which the temperature inside the first container and/or the temperature inside the second container is lowered to room temperature, and a process in which the inside of the first container is opened to a normal atmosphere, wherein, the maximum temperature of the annealing process is set to be a first temperature within the range of 1020° C. to 1150° C.

The invention also provides a manufacturing method for a single crystal of calcium fluoride, having its optical properties improved through an annealing process in which a single crystal of calcium fluoride is contained in a sealable container, and the container is sealed and vacuumed, followed by, a process of heating with a heater arranged external to the container such that the temperature inside the container is raised to a first temperature, which is lower than the melting point of the single crystal of calcium fluoride, a process by which the temperature inside the container is maintained at the first temperature for a designated period of time, and a process by which the temperature inside the container is lowered to room temperature, wherein, a balance between the effect of improving the optical properties of the single crystal of calcium fluoride and productivity (delivery time and cost) is achieved, such that, during the cooling process in the high temperature range, in which there is a particularly great effect from the cooling speed on the improvement of the optical properties of the single crystal of calcium fluoride, the cooling is conducted with sufficient slowness. However, during the cooling process in the low temperature range (the range with a lower temperature than the high temperature range), which has less of such an effect, the cooling is faster as the temperature gets lower.

The invention also provides a manufacturing method for a single crystal of calcium fluoride, having its optical properties improved through an annealing process in which a single crystal of calcium fluoride is contained in a sealable container, and the container is sealed and vacuumed, followed by, a process of heating with a heater arranged external to the container such that the temperature inside the container is raised to a first temperature, which is lower than the melting point of the single crystal of calcium fluoride, a process by which the temperature inside the container is maintained at the first temperature for a designated period of time, and a process by which the temperature inside the container is lowered to room temperature, wherein, an annealing process is carried out by filling an inert gas in the container, and maintaining the atmosphere inside the container at 1 atm (or approximately 1 atm) in order to prevent oxidation of the single crystal of calcium fluoride during the annealing process.

The invention also provides a manufacturing method for a single crystal of calcium fluoride having its optical properties improved through an annealing process in which a second container containing a single crystal of calcium fluoride and a fluorination agent is arranged in a sealable first container, the first container is sealed, and the inside of the first container is vacuumed, followed by, a process in which, by heating with a heater arranged external to the first container, the temperature inside the first container and/or the temperature inside the second container is raised to a first temperature, which is lower than the melting point of the single crystal of calcium fluoride, while the second container is filled with a fluorine gas atmospheres a process in which the temperature inside the first container and/or the temperature inside the second container is maintained at the first temperature for a designated period of time, a process in which the temperature inside the first container and/or the temperature inside the second container is lowered to room temperature, and a process in which the inside of the first container is opened to a normal atmosphere, wherein, at a minimum, in order to prevent oxidation of the single crystal of calcium fluoride during the annealing process, the annealing process is carried out such that, the fluorination agent is vaporized and becomes a fluorine gas atmosphere inside of the second container, while the pressure inside the first container is maintained at 1 atm (or approximately 1 atm).

The invention also provides a manufacturing method for a single crystal of calcium fluoride having its optical properties improved through an annealing process in which, its maximum temperature during the annealing process is set to a first temperature which is within the range of 1020 to 1150° C., and which is maintained for a designated period of time, and its cooling speed for reaching a second temperature, which is in the range of (or around) 600° C. to 800° C., from the first temperature is set to be 2° C./hour or less, or its cooling speed for reaching a second temperature, which is in the range of (or around) 700° C. to 900° C., from the first temperature is set to be 2° C./hour or less.

The invention also provides a manufacturing method for a single crystal of calcium fluoride, having its optical properties improved through an annealing process in which a single crystal of calcium fluoride is contained in a sealable container, and the container is sealed and vacuumed, followed by, a process of heating with a heater arranged external to the container so that the temperature inside the container is raised to a first temperature, which is lower than the melting point of the single crystal of calcium fluoride, a process by which the temperature inside the container is maintained at the first temperature for a designated period of time, and a process by which the temperature inside the container is lowered to room temperature, wherein, the maximum temperature of the annealing process is set to be a first temperature within the range of 1020° C. to 1150° C., and the cooling speed for reaching a second temperature, which is in the range of (or around) 600 aC to 800° C. from the first temperature, is set to be 2° C./hour or less, or the cooling speed for reaching a second temperature, which is in the range of (or around) 700° C. to 900° C. from the first temperature, is set to be 2° C./hour or less.

The invention also provides a manufacturing method for a single crystal of calcium fluoride having its optical properties improved through an annealing process in which a second container containing a single crystal of calcium fluoride and a fluorination agent is arranged in a sealable first container, the first container is sealed, and the inside of the first container is vacuumed, followed by, a process in which by heating with a heater arranged external to the first container, the temperature inside the first container and/or the temperature inside the second container is raised to a first temperature, which is lower than the melting point of the single crystal of calcium fluoride, while the second container is filled with a fluorine gas atmosphere, a process in which the temperature inside the first container and/or the temperature inside the second container is maintained at the first temperature for a designated period of time, a process in which the temperature inside the first container and/or the temperature inside the second container is lowered to room temperature, and a process in which the inside of the first container is opened to a normal atmosphere, wherein, the maximum temperature of the annealing process is set to be a first temperature within the range of 1020° C. to 1150° C., and the cooling speed for reaching a second temperature, which is in the range of (or around) 600° C. to 800° C. from the first temperature, is set to be 1.2° C./hour or less, or the cooling speed for reaching a second temperature, which is in the range of (or around) 700° C. to 900° C. from the first temperature, is set to be 1.2° C./hour or less.

The invention further provides a method of manufacturing for a single crystal of calcium fluoride for photolithography (a wavelength of 250 nm or less) with a large diameter (ø 200 mm or greater) wherein the double refraction value, in the direction of the axis of light, is 2 nm/cm or less.

For the annealing process that is conducted in order to improve the optical properties; of a single crystal of calcium fluoride (such as reducing double refraction), not only are the kind of device and atmosphere that are utilized important, but also the type of schedule that is used becomes an important point. For example, it is essential for schedules to include what the maximum temperature in degrees ° C. of the annealing should be, how long it should take to increase the temperature from room temperature to the maximum temperature, how long the. maximum temperature should be maintained, and then how long it should take to cool to room temperature.

Therefore, after the present inventor's diligent research, it was found that 1020° C. to 1150° C. is the optimum maximum temperature. In other words, when the maximum temperature is 1150° C. or greater, defects, which become the cause of scattering, are easily generated inside the calcium fluoride. When the maximum temperature is 1020° C. or less, the annealing effect to improve the optical properties is not sufficient. Therefore, the manufacturing method of the present invention has the maximum temperature of the annealing process set to be a designated temperature (first temperature) within the range of 1020° C. to 1150° C.

Therefore, with the present invention, it is possible to obtain a single crystal of calcium fluoride with a uniform refractive index and sufficiently small double refraction, which can be used in an optical system for photolithography, and in particular, it is possible to obtain a single crystal of calcium fluoride with a large diameter (ø 200 mm or greater) having desirable optical properties, that can be used for photolithography with a wavelength of 250 nm or less.

For example, approximately 24 hours is adequate for the period of time that said maximum temperature should be maintained, however, it is desirable that as the diameter and mass of the processed object (single crystal of calcium fluoride) increases, the period also increases. The heating speed from room temperature to the maximum temperature can be set to the extent that there are no adverse effects on the processed object (single crystal of calcium fluoride) due to the thermal shock.

Next, the cooling process after the maximum temperature is maintained for the designated period of time, as mentioned above, is described. This process is particularly important in order to improve the optical properties of the processed object (single crystal of calcium fluoride). In other words, the slower the cooling speed, the greater the effect of the improvement on the optical properties. However, when the cooling speed is too quick, an adequate effect cannot be obtained. Therefore, in the manufacturing method of the present invention, the cooling speed from said maximum temperature (first temperature) to room temperature is set to be 2° C./hour or less.

The present inventors discovered that the cooling speed in the high temperature range from the maximum temperature to the designated temperature (second temperature), which is in the range of (or around) 600° C. to 800° C., or in the range of (or around) 700° C. to 900° C., in particular, imparts a great effect on the optical properties of the processed object (single crystal of calcium fluoride). Therefore, in the manufacturing method of the present invention, the cooling speed from said maximum temperature (first temperature) to a designated temperature (second temperature), which is in the range of (or around) 600° C. to 800° C., or in the range of (or around) 700° C. to 900° C., is set to be 2° C./hour or less. With the present invention, it is possible to obtain a single crystal of calcium fluoride with a large diameter (ø 200 mm or greater) having extremely superior optical properties, that can be used for photolithography with a wavelength of 250 nm or less.

The length of the cooling period imparts a great effect on productivity (delivery time and cost), and therefore, from this point of view, it is desirable to have as short a cooling period as possible. Thus, the present inventors has created a balance between the effect of improving the optical properties of the processed object (single crystal of calcium fluoride) and productivity, such that, during the cooling process in the high temperature range, for which there is a particularly great effect from the cooling speed on the improvement of the optical properties of the processed object (single crystal of calcium fluoride), the cooling is conducted with sufficient slowness as described above. However, during the cooling process in the low temperature ranges, which has less of such an effect, it is cooled faster as the temperature gets lower. More precisely, in the manufacturing method of the present invention, during the cooling process in the high temperature range, which is from said designated temperature (first temperature) to another designated temperature (second temperature), which is in the range of (or around) 600° C. to 800° C. or 700° C. to 900° C., the cooling speed is set to be 2° C./hour or less, and during the cooling process in the low temperature range, which is from said designated temperature (second temperature) to room temperature, the cooling speed is set to be 5° C./hour or less. Therefore, with the present invention, not only can a single crystal of calcium fluoride with a large diameter (ø 200 mm or greater) having superior optical properties be obtained by said effect, but also, said effect and productivity are balanced.

As described above, for the annealing process for a large diameter calcium fluoride (ø 200 mm or greater), it is important to cool very slowly (cooling speed: 2° C./hour or less) during the cooling process in the high temperature range, because there is a very large effect on the improvement of the optical properties of the processed object (single crystal of calcium fluoride) due to the cooling speed. For example, as described in a comparative example later, the cooling is carried out from the maximum temperature to 900° C. (high temperature range) with the overly fast speed of 3° C./hour, and calcium fluoride with superior optical properties could not be obtained.

Also, for the later cooling process in the low temperature range, sudden cooling should be avoided. It is preferable to make a single process (a cooling speed) into multiple stages (two or more cooling speeds) during the cooling process in the high temperature range and/or low temperature range (in particular the cooling process at high temperatures), as the processed object (single crystal of calcium fluoride) becomes larger.

In other words, it is preferable to subdivide (add one, or two or more cooling processes at a speed which is lower than a cooling speed during a single stage) the cooling process in the high temperature range and/or low temperature range (in particular, the cooling process at high temperatures) as the processed object (single crystal of calcium fluoride) becomes larger, to the extent that productivity can be adequately upheld. In this case, along with the increase in the number of subdivisions, the entire high temperature range and/or low temperature range can be expanded.

In addition, as the processing object (single crystal of calcium fluoride) becomes larger, it is preferable that the temperature range in which the second temperature is included is raised (shifted to a higher temperature) and the temperature range is narrowed to the extent that the productivity can be sufficiently maintained. For example, as the processed object (single crystal of calcium fluoride) becomes larger, it is preferable to change the temperature range of 600° C. to 800° C. or the range of (or around) 700° C. to 900° C., in which the second temperature is included, to a higher or narrower range such as 650° C. to 850° C., 750° C. to 950° C., 700° C. to 800° C., 800° C. to 900° C., 800° C. to 850° C., 850° C. to 900° C., or 900° C. to 950° C., to the extent that productivity can be sufficiently maintained.

Alternatively, as the processed object (single crystal of calcium fluoride) becomes larger, it is preferable to appropriately use together some conditions such as the subdivisions of the cooling process, expansion or reduction of the temperature range in which the second temperature is included, and the shifting of each temperature range to a higher temperature, to the extent that productivity can be sufficiently maintained. By having said structure, even if the processed object (single crystal of calcium fluoride) is farther enlarged, not only can a single crystal of calcium fluoride with a large diameter having superior optical properties, which can be used for photolithography with a wavelength of 250 nm or less, be obtained, but also productivity can be sufficiently maintained.

The manufacturing method of the single crystal of calcium fluoride of the present invention is effective for obtaining a single crystal of calcium fluoride with a large diameter (ø 200 mm or greater) and a double refraction value in the direction of the axis of light of 2 nm/cm or less, which can be used in an optical system for photolithography with a wavelength of 250 nm or less. Furthermore, the manufacturing method of the single crystal of calcium fluoride of the present invention is effective for obtaining a single crystal of calcium fluoride with a large diameter (ø 200 mm or greater) and a double refraction value in the off-axis direction perpendicular to the axis of light of 5 nm/cm or less, which can be used in an optical system for photolithography with a wavelength of 250 nm or less.

The manufacturing method of the single crystal of calcium fluoride of the present invention is effective for obtaining a single crystal of calcium fluoride with a large diameter (ø 200 mm or greater) that can be used in an optical system for photolithography with a wavelength of 250 nm or less. In addition, the manufacturing method of the single crystal of calcium fluoride of the present invention is effective for obtaining a single crystal of calcium fluoride, with a large diameter (ø 200 mm or greater) and a difference in the refractive index Δn of $2 \times 10^{-6}$ or less that can be used in an optical system for photolithography with a wavelength of 250 nm or less.

As described above, calcium fluoride with a small double refraction, which has not been possible for calcium fluoride of ø 200 mm or greater, becomes possible with the present invention. Therefore, calcium fluoride that can be used in practice for photolithography (with a wavelength of 250 nm or less) can be supplied. In addition, the uniformity of the refractive index has reached adequate uniformity. Namely, in the past, a single crystal of calcium fluoride with a large diameter (ø 200 mm or greater) and a small double refraction value for photolithography (wavelength of 250 nm or less), could not be obtained, however, it is now possible to manufacture such a crystal with the present invention.

The measurement of the double refraction for a material (calcium fluoride) with a diameter of 200 mm and a thickness of 50 mm was carried out in the direction perpendicular to the plane (hereinafter referred to as the direction of the axis of light) and in the direction perpendicular to that (hereinafter referred to as the off-axis direction). There was a rotation of 360 degree in the off-axis direction, however, when the measurement was carried out, it was found that they had approximately the same value. In addition, it was found that the one in the off-axis direction had twice the optical path difference per unit length than the one in the direction of the axis of light.

It is preferable that the manufacturing device used for the present invention, to obtain calcium fluoride with superior optical properties with annealing, is comprised of a container to surround the processed object (calcium fluoride) and a heating device external to it. In addition, it is desirable for the processed object (calcium fluoride) to not experience an unevenness in temperature during the annealing process.

An atmosphere of inert gas, a vacuum atmosphere or a fluorine atmosphere is used for the atmosphere during the annealing process because the oxidation reaction of calcium fluoride progresses in an ordinary atmosphere at 700° C. or greater. In addition, it is desirable to set the pressure inside said container or the first container to be 1 atm (or approximately 1 atm), which is equivalent (or approximately equivalent) to the normal atomospheric pressure so that a single crystal of calcium fluoride for photolithography (wavelength of 250 nm or less) can be obtained with stability. This is because it prevents deformation and destruction of the annealing container (a sealable container or first container) due to the difference between the normal atmospheric pressure (outside of the container) and the pressure inside the container under high temperature conditions.

The present invention is described in detail using embodiments as follows, however, the present invention is not limited to these examples.

First Preferred Embodiment

The manufacturing device of the present embodiments, having the purpose of obtaining calcium fluoride with superior optical properties using an annealing process, is comprised of a sealable first container (stainless container) that is sealed and vacuumed after a single crystal of calcium fluoride to be annealed is placed in it, a second container (carbon container) with the single crystal of calcium fluoride and a fluorination agent placed in it, which is arranged in said first container, a vacuuming system connected to said first container and a heater arranged external to said first container.

Using this device, a single crystal of calcium fluoride with a large diameter (ø 200 mm or greater) having superior optical properties that can be used for photolithography with a wavelength of 250 nm or less was obtained by annealing calcium fluoride with a size of ø 200 mm×50 mm with the following schedule. As shown in FIG. 1, the entire process takes approximately 13 days.

TABLE 1

| Temperature schedule | Speed of temperature change | Required time |
| --- | --- | --- |
| 20 → 1050° C. | 50° C./h | 21 h |
| 1050 → 1050° C. | — | 24 h |
| 1050 → 900° C. | 2° C./h | 75 h |
| 900 → 20° C. | 5° C./h | 176 h |

In other words, with the manufacturing method of the present embodiment, the maximum temperature of the annealing was set to be 1050° C. (first temperature within the range of 1020° C. to 1150° C.) and maintained for a designated period of time (24 hours). During the cooling process in the high temperature range from said first temperature to 900° C. (second temperature in the range of 600° C. to 800° C. or in the range of 700° C. to 900° C.), the cooling speed was set to be 2° C./hour (2° C./hours or less). In addition, during the cooling process in the low temperature range, from said second temperature to room temperature, the cooling speed was set to be 5° C./hour (5° C./hour or less).

The double refraction and the uniformity of the refractive index of the manufactured single crystal of calcium fluoride was measured. The maximum value of the double refraction (in the direction of the axis of light) was 1.5 nm/cm and the off-axis strain (double refraction in the off-axis direction) was 5 nm/cm. In addition, the uniformity of the refractive index was Δn=1.2E-6, and the RMS (root mean square) after spherical adjustment was 70E-4λ (λ=632.8 nm). It had highly superior optical properties that can be used for photolithography with a wavelength of 250 nm or less.

In the present embodiment, because the cooling speed during the cooling process in the high temperature range has a particularly great effect on the improvement of the optical properties of the processed object (single crystal of calcium fluoride) cooling was conducted in the high temperature range with sufficient slowness. During the cooling process at the low temperature range, which has less of such an effect, the cooling was accelerated when the temperature decreased. Therefore, a balance between the effect of improving the optical properties of the processed object (single crystal of calcium fluoride) and productivity was achieved.

Therefore, with the present embodiment, it is possible to obtain a single crystal of calcium fluoride with a uniform refractive index and sufficiently small double refraction, which can be used in an optical system for photolithography. Not only is it possible to obtain a single crystal of calcium fluoride with a large diameter (ø 200 mm or greater) having

Second Preferred Embodiment

Figure 2:
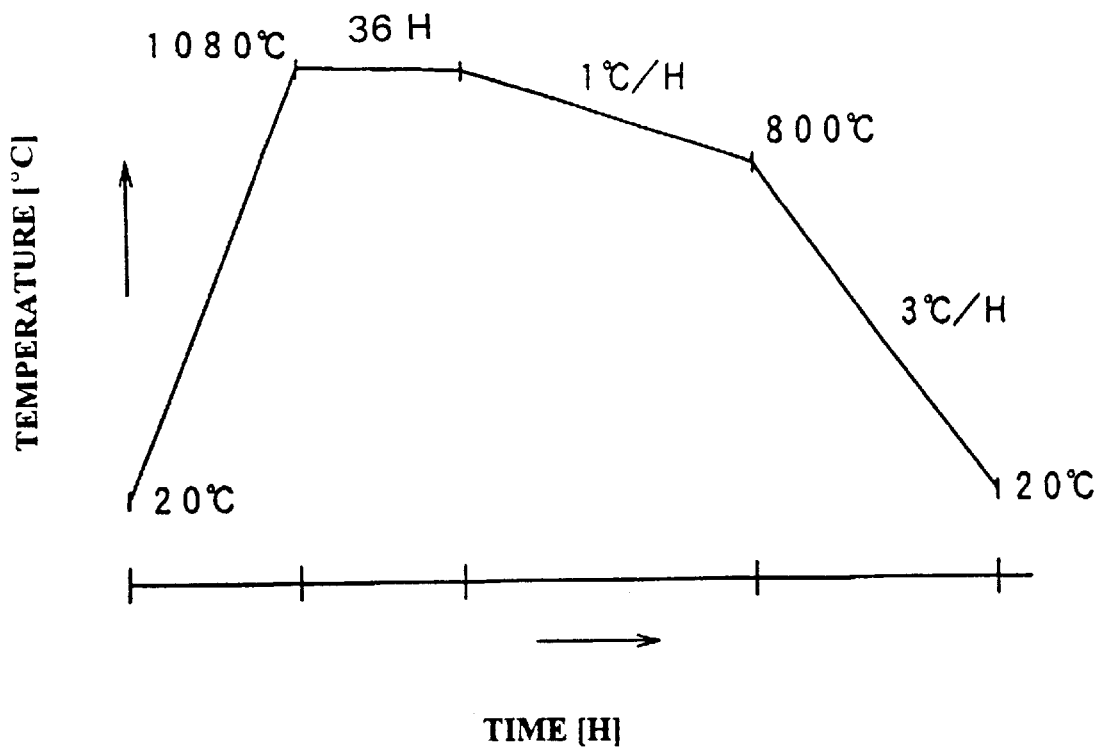
FIG. 2 is a temporal graph that shows the schedule of the annealing process in the second preferred embodiment.

Using the same device as in the first embodiment, a single crystal of calcium fluoride with a large diameter (ø 200 mm or greater) having superior optical properties, which can be used for photolithography with a wavelength of 250 nm or less, was manufactured by annealing calcium fluoride with a size of ø 210 mm×52 mm, with the following schedule. As shown in FIG. 2, the entire process takes approximately 25 days.

TABLE 2

| Temperature schedule | Speed of temperature change | Required time |
| --- | --- | --- |
| 20 → 1080° C. | 30° C./h | 35 h |
| 1080 → 1080° C. | — | 36 h |
| 1080 → 800° C. | 1° C./h | 280 h |
| 800 → 20° C. | 3° C./h | 260 h |

In other words, with the manufacturing method of the present embodiment, the maximum temperature was set to be 1080° C. (first temperature in the range of 1020° C. to 1150° C.) and it was maintained for a designated period of time (36 hours). During the cooling process in the high temperature range from said first temperature to 800° C. (second temperature in the range of 600° C. to 800° C. or in the range of 700° C. to 900° C.), the cooling speed was set to be 1° C./h (2° C./h or less). During the cooling process in the low temperature range from said third temperature to room temperature, the cooling speed was set to be 3° C./h (5° C./h or less).

The double refraction and the uniformity of the refractive index of the manufactured single crystal of calcium fluoride were measured. The maximum value of the double refraction (in the direction of the axis of light) was 1.8 nm/cm and the off-axis strain (double refraction in the off-axis direction) was 4 nm/cm. In addition, the uniformity of the refractive index was Δn=1.8E-6, and the RMS (root mean square) after spherical adjustment was 58E-4λ (λ=632.8 nm). It had highly superior optical properties, which can be used for photolithography with a wavelength of 250 nm or less.

In the present embodiment, because the cooling speed during the cooling process in the high temperature range has a particularly great effect on the improvement of the optical properties of the processed object (single crystal of calcium fluoride), cooling was conducted in the high temperature range with sufficient slowness. During the cooling process in the low temperature ranges, which has less of such an effect, the cooling was accelerated when the temperature decreased. Therefore, a balance between the effect of improving the optical properties of the processed object (single crystal of calcium fluoride) and productivity was achieved.

Therefore, with the present embodiment, it is possible to obtain a single crystal of calcium fluoride with a uniform refractive index and a sufficiently small double refraction, which can be used for photolithography. Not only is it possible to obtain a single crystal of calcium fluoride with a large diameter (ø 200 mm or greater) having superior optical properties, which can be used in particular for photolithography with a wavelength of 250 nm or less, but also productivity can be adequately maintained.

First Comparative Example

Figure 3:
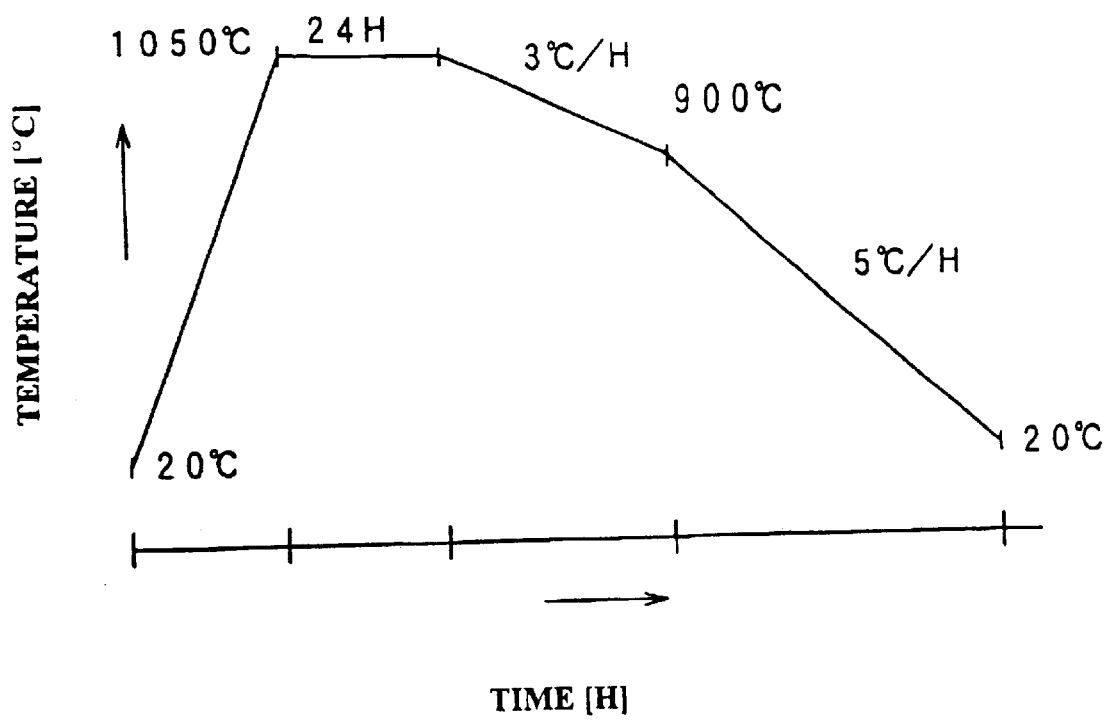
FIG. 3 is a temporal graph that shows the schedule of the annealing process in the first comparative example of the prior art.

Using the same device as in the first embodiment, a single crystal of calcium fluoride was manufactured by annealing calcium fluoride with a size of ø 200 mm×50 mm with the following schedule. As shown in FIG. 3, the entire process takes approximately 12 days.

TABLE 3

| Temperature schedule | Speed of temperature change | Required time |
| --- | --- | --- |
| 20 → 1050° C. | 50° C./h | 21 h |
| 1050 → 1050° C. | — | 24 h |
| 1050 → 900° C. | 3° C./h | 50 h |
| 900 → 20° C. | 5° C./h | 176 h |

In other words, in the manufacturing method of the present comparative example, the maximum temperature of the annealing was set to be 1050° C. and it was maintained for a designated period of time (24 hours). Then it was cooled at a speed of 3° C./h to 900° C. Then from 900° C. to room temperature, the cooling speed was set to be 5° C./h in order to have better productivity.

The double refraction and the uniformity of the refractive index of the manufactured single crystal of calcium fluoride was measured. The maximum value of the double refraction (in the direction of the axis of light) was 3.2 nm/cm and the off-axis strain (double refraction in the off-axis direction) was 16 nm/cm. Therefore, it did not possess optical properties that could be used for photolithography with a wavelength of 250 nm or less. Namely, in the present comparative example, during the cooling process in the high temperature range, which has a very large effect on the improvement of the optical properties of the processed object (single crystal of calcium fluoride) due to the cooling speed, cooling was carried out so fast that a single crystal of calcium fluoride with superior optical properties that could be used for photolithography with a wavelength of 250 nm or less could not be obtained.

As described above, with the present invention, a single crystal of calcium fluoride with superior uniformity of the refractive index and a sufficiently small double refraction, which can be used in an optical system for photolithography can be obtained. In particular, a single crystal of calcium fluoride with a large diameter (ø 200 mm or greater) having superior optical properties, which can be used for photolithography with a wavelength of 250 nm or less can be obtained. In addition, with the present invention, not only can a single crystal of calcium fluoride with a large diameter (ø 200 mm or greater) having superior optical properties be obtained, but also productivity can be sufficiently maintained.

With the present invention, calcium fluoride with a small double refraction, which has been impossible in the past for a large calcium fluoride of ø 200 mm or greater, can be obtained. Therefore, calcium fluoride that can be used in practice for photolithography (wavelength of 200 nm or less) can be supplied. In addition, the uniformity of the refractive index has reached a sufficient uniformity. The period of time required for the annealing process is 2 to 4 weeks. This period of time is not a problem for production, and costs can be maintained at a minimum.

Next will be considered a manufacturing process whereby it is possible to obtain a single crystal of calcium fluoride with a uniform refractive index and sufficiently small double refraction, which can be used in an optical system for photolithography, and in particular, it is possible to obtain a single crystal of calcium fluoride with a large diameter (ø 230 mm or greater) having desirable optical properties, that can be used for photolithography with a wavelength of 250 nm or less.

It is desirable if the period of time that the maximum temperature, as described above, is maintained is longer when the diameter and mass of the processed object (single crystal of calcium fluoride) is greater. For example, when a single crystal of calcium fluoride with ø 230 mm or greater and a thickness of 50 mm or greater is annealed, it is desirable to have the maintenance time be 48 hours or greater. The heating speed from room temperature to the maximum temperature can be set to the extent that there are no adverse effects on the processed object (single crystal of calcium fluoride) due to the thermal shock.

Next, the cooling process after the maximum temperature is maintained for the designated period of time, as mentioned above, is described. This process is particularly important in order to improve the optical properties of the processed object (single crystal of calcium fluoride). In other words, the slower the cooling speed, the greater the effect of improvement on the optical properties. However, when the cooling speed is too quick, an adequate effect cannot be obtained.

The present inventors discovered that the cooling speed in the high temperature range from the maximum temperature to a designated temperature (second temperature), which is in the range of (or around) 600° C. to 800° C., or in the range of (or around) 700° C. to 900° C., in particular, imparts a great effect on the optical properties of the processed object (single crystal of calcium fluoride). Therefore, in the manufacturing method of the present invention, a single crystal of calcium fluoride with improved optical properties is manufactured by maintaining it at the maximum temperature of the annealing process, which is a designated temperature (first temperature) and which is in the range of 1020° C. to 1150° C., for a designated period of time, and then during the cooling process in the high temperature range, from said designated temperature (first temperature) to a designated temperature (second temperature), which is in the range of (or around) 600° C. to 800° C., or in the range of (or around) 700° C. to 900° C., the cooling speed is set to be 1.2°/hour or less. Therefore, with the present invention, it is possible to obtain a single crystal of calcium fluoride with a uniform refractive index and sufficiently small double refraction, which can be used in an optical system for photolithography, and in particular, it is possible to obtain a single crystal of calcium fluoride with a large diameter (ø 230 mm or greater) having desirable optical properties, that can be used for photolithography with a wavelength of 250 nm or less.

The length of the cooling period imparts a great effect on productivity, and therefore, from this point of view, it is desirable to have as short a cooling period as possible. Thus, the present inventors has created a balance between the effect of improving the optical properties of the processed object (single crystal of calcium fluoride) and productivity, such that, during the cooling process in the high temperature range, for which there is a particularly great effect from the cooling speed on the improvement of the optical properties of the processed object (single crystal of calcium fluoride), the cooling is conducted with sufficient slowness as described above. However, during the cooling process in the middle and low temperature ranges, which has less of such an effect, it is cooled faster as the temperature gets lower.

In other words, during the cooling process in the middle temperature range, which is from said designated temperature (second temperature) to another designated temperature (third temperature), which is in the range of (or around) 400° C. to 500° C. or 500° C. to 600° C., the cooling speed is set to be 3° C./hour or less, and during the cooling process in the low temperature range, which is from said designated temperature (third temperature) to room temperature, the cooling speed is set to be 5° C./hour or less. Therefore, with the present invention, not only can a single crystal of calcium fluoride with a large diameter (ø 230 mm or greater) having superior optical properties be obtained by said effect, but also, said effect and productivity are balanced.

As described above, for the annealing process for a large diameter calcium fluoride (ø 230 mm or greater), it is important to cool very slowly (cooling speed: 1.2° C./hour or less) during the cooling process in the high temperature range, because there is a very large effect on the improvement of the optical properties of the processed object (single crystal of calcium fluoride) due to the cooling speed. Even for the cooling process in the middle and low temperature ranges, it is better to avoid sudden cooling. For example, as described in a comparative example later, even if cooling is carried out from the maximum temperature to 900° C. (high temperature range) at a speed of 0.7° C./hour, if it is then cooled (middle and low temperature range) with the overly fast speed of 5° C./hour, calcium fluoride with superior optical property cannot be obtained.

It is preferable to make a single process (cooling speed) into multiple stages (two or more cooling speeds) during the cooling process in the high temperature range and/or middle temperature range (in particular the cooling process at high temperatures), as the processed object (single crystal of calcium fluoride) becomes larger. In other words, it is preferable to subdivide (add one, or two or more cooling processes at a speed which is lower than the cooling speed during a single stage) the cooling process in the high temperature range and/or middle temperature range (in particular, the cooling process at high temperatures) as the processed object (single crystal of calcium fluoride) becomes larger, to the extent that productivity can be adequately maintained. In this case, along with the increase in the number of subdivisions, the entire high temperature range and/or middle temperature range can be expanded.

In addition, as the processing object (single crystal of calcium fluoride) becomes larger, it is preferable that the temperature ranges in which the second and third temperatures are included are raised (shifted to a higher temperature) and the temperature ranges are narrowed to the extent that the productivity can be sufficiently maintained. For example, as the processed object (single crystal of calcium fluoride) becomes larger, it is preferable to change the temperature range of 600 to 800° C. or the range of (or around) 700° C. to 900° C., in which the second temperature is included, to a higher or narrower range such as 650° C. to 850° C., 750° C. to 950° C., 700° C. to 800° C., 800° C. to 900° C., 800° C. to 850° C., 850° C. to 900° C., or 900° C. to 950° C., to the extent that productivity can be sufficiently maintained.

Alternatively, as the processed object (single crystal of calcium fluoride) becomes larger, it is preferable to appropriately use together some conditions such as the subdivisions of the cooling process, expansion or reduction of the temperature ranges in which the second and third temperature are included, and the shifting of each temperature range to a higher temperature, to the extent that productivity can be sufficiently upheld. By having said structure, even if the processed object (single crystal of calcium fluoride) is further enlarged, not only can a single crystal of calcium fluoride with a large diameter having superior optical properties, which can be used for photolithography with a wavelength of 250 nm or less, be obtained, but also productivity can be sufficiently maintained.

The manufacturing method of the single crystal of calcium fluoride of the present invention is effective for obtaining a single crystal of calcium fluoride with a large diameter (ø 230 mm or greater) that can be used in an optical system for photolithography with a wavelength of 250 nm or less (in particular, a wavelength of 200 nm or less). In addition, the manufacturing method of the single crystal of calcium fluoride of the present invention is effective for obtaining a single crystal of calcium fluoride with a large diameter (ø 230 mm or greater) and a difference in the refractive index an of $2\times10^{-6}$ or less that can be used in an optical system for photolithography with a wavelength of 250 nm or less (in particular, a wavelength of 200 nm or less).

Moreover, the manufacturing method of the single crystal of calcium fluoride of the present invention is effective for obtaining a single crystal of calcium fluoride with a large diameter (ø 230 mm or greater) and a double refraction value in the direction of the axis of light of 2 nm/cm or less, which can be used in an optical system for photolithography with a wavelength of 250 nm or less (in particular, a wavelength of 200 nm or less).

Furthermore, the manufacturing method of the single crystal of calcium fluoride of the present invention is effective for obtaining a single crystal of calcium fluoride with a large diameter (ø 230 mm or greater) and a double refraction value in the off-axis direction perpendicular to the axis of light of 5 nm/cm or less, which can be used in an optical system for photolithography with a wavelength of 250 nm or less (in particular, a wavelength of 200 nm or less).

As described above, calcium fluoride with a small double refraction, which could not be achieved with calcium fluoride of ø 230 mm or greater, becomes possible with the present invention. Therefore, calcium fluoride that can be used in practice for photolithography (with a wavelength of 250 nm or less, and in particular, a wavelength of 200 nm or less) can be supplied. In addition, the uniformity of the refractive index has reached adequate uniformity. Namely, in the past, a single crystal of calcium fluoride with a large diameter (ø 230 mm or greater) and a small double refraction value for photolithography (wavelength of 200 nm or less) could not be obtained, however, it is now possible to manufacture such a crystal with the present invention.

The measurement of the double refraction for a material (calcium fluoride) with a diameter of 250 mm and a thickness of 60 mm was carried out in the direction perpendicular to the plane (hereinafter referred to as the direction of the axis of light) and in the direction perpendicular to that (hereinafter referred to as the off-axis direction). There was a rotation of 360 degree in the off-axis direction, however, when the measurement was carried out it was found that they had approximately the same value. In addition, it was found that the one in the off-axis direction had twice the optical path difference per unit length than the one in the direction of the axis of light.

It is preferable that the manufacturing device used for the present invention, in order to obtain calcium fluoride with superior optical properties with annealing, is comprised of a container to surround the processed object (calcium fluoride) and a heating device external to it. In addition, it is desirable for the processed object (calcium fluoride) to not experience an unevenness in temperature during the annealing process. An atmosphere of inert gas, a vacuum atmosphere or a fluorine atmosphere are used for the atmosphere during the annealing process, because the oxidation reaction of calcium fluoride progresses in an ordinary atmosphere at 700° C. or greater.

The present invention is described in detail using embodiments as follows, however, the present invention is not limited to these examples.

Third Preferred Embodiment

The manufacturing device of the present embodiments, having the purpose of obtaining calcium fluoride with superior optical properties using an annealing process, is comprised of a sealable first container (stainless container) that is sealed and vacuumed after a single crystal of calcium fluoride to be annealed is placed in it, a second container (carbon container) with the single crystal of calcium fluoride and a fluorination agent placed in it, which is arranged in said first container, a vacuuming system connected to said first container and a heater arranged external to said first container.

Figure 4:
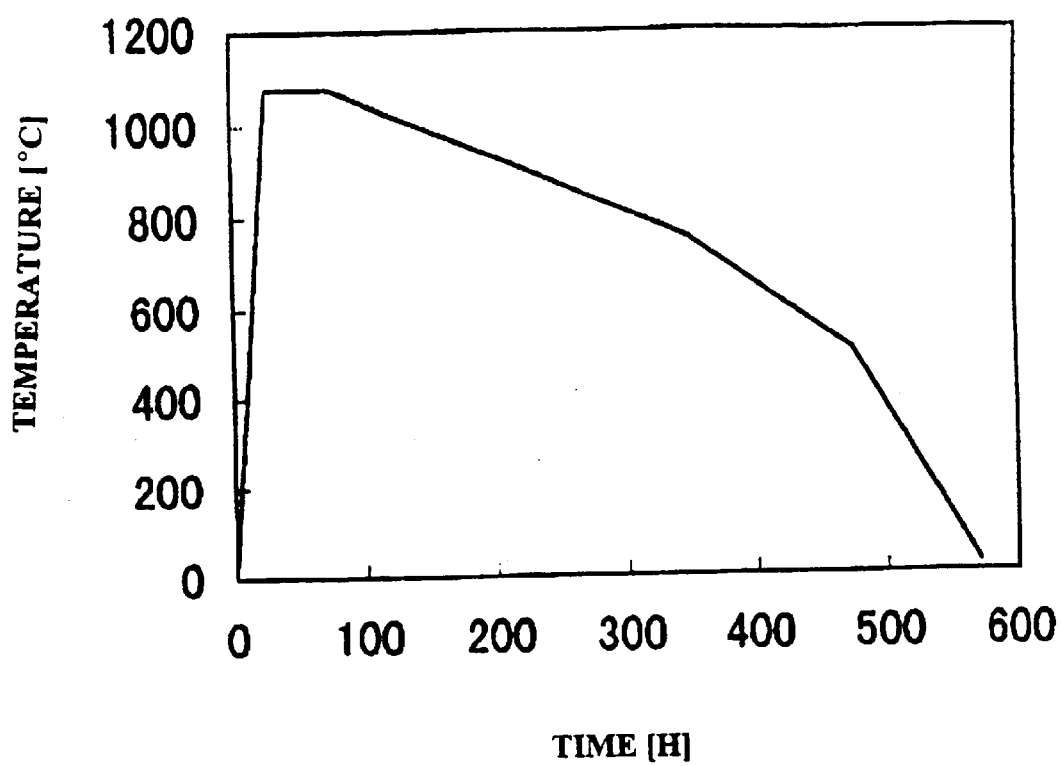
FIG. 4 is a temporal graph that shows the schedule of the annealing process in the third preferred embodiment.

Using this device, a single crystal of calcium fluoride with a large diameter (ø 230 mm or greater) having superior optical properties that can be used for photolithography with a wavelength of 250 nm or less was obtained by annealing calcium fluoride with a size of ø 240 mm×50 mm with the following schedule. As shown in FIG. 4, the entire process takes approximately 24 days.

TABLE 4

| Temperature schedule | Speed of temperature change | Required time |
| --- | --- | --- |
| 20 → 1080° C. | 40° C./h | 27 h |
| 1080 → 1080° C. | — | 48 h |
| 1080 → 750° C. | 1.2° C./h | 275 h |
| 750 → 500° C. | 2° C./h | 125 h |
| 500 → 20° C. | 5° C./h | 96 h |

In other words, with the manufacturing method of the present embodiment, the maximum temperature of the annealing was set to be 1080° C. (first temperature within the range of 1020° C. to 1150° C.) and maintained for a designated period of time (48 hours). During the cooling process in the high temperature range from said first temperature to 750° C. (second temperature. in the range of 600° C. to 800° C. or in the range of 700° C. to 900° C.), the cooling speed was set to be 1.2° C./hour (1.2° C./hours or less).

In addition, during the cooling process in the medium temperature range, from said second temperature to 500° C. (third temperature in the range of 400° C. to 500° C. or 500° C. to 600° C.), the cooling speed was set to be 2° C./hour (3° C./hour or less) and during the cooling process in the low temperature range, from said third temperature to room temperature, the cooling speed was set to be 5° C./hour (5° C./hour or less).

The double refraction and the uniformity of the refractive index of the manufactured single crystal of calcium fluoride was measured. The maximum value of the double refraction (in the direction of the axis of light) was 1.7 nm/cm and the off-axis strain (double refraction in the off-axis direction) was 4 nm/cm In addition, the uniformity of the refractive index was Δn=1.8E-6, and the RMS (root mean square) after spherical adjustment was 65E-4λ (λ=632.8 nm). It had highly superior optical properties that can be used for photolithography with a wavelength of 250 nm or less (in particular, a wavelength of 200 nm or less).

In the present embodiment, because the cooling speed during the cooling process in the high temperature range has a particularly great effect on the improvement of the optical properties of the processed object (single crystal of calcium fluoride), cooling was conducted in the high temperature range with sufficient slowness. During the cooling process at the middle and low temperature ranges, which has less of such an effect, the cooling was accelerated when the temperature decreased. Therefore, a balance between the effect of improving the optical properties of the processed object (single crystal of calcium fluoride) and productivity was achieved.

Therefore, with the present embodiment, it is possible to obtain a single crystal of calcium fluoride with a uniform refractive index and sufficiently small double refraction, which can be used in an optical system for photolithography. Not only is it possible to obtain a single, crystal of calcium fluoride with a large diameter (ø 230 mm or greater) having superior optical properties, which can be used in particular for photolithography with a wavelength of 250 nm or less, but also productivity can be adequately maintained.

Fourth Preferred Embodiment

Figure 5:
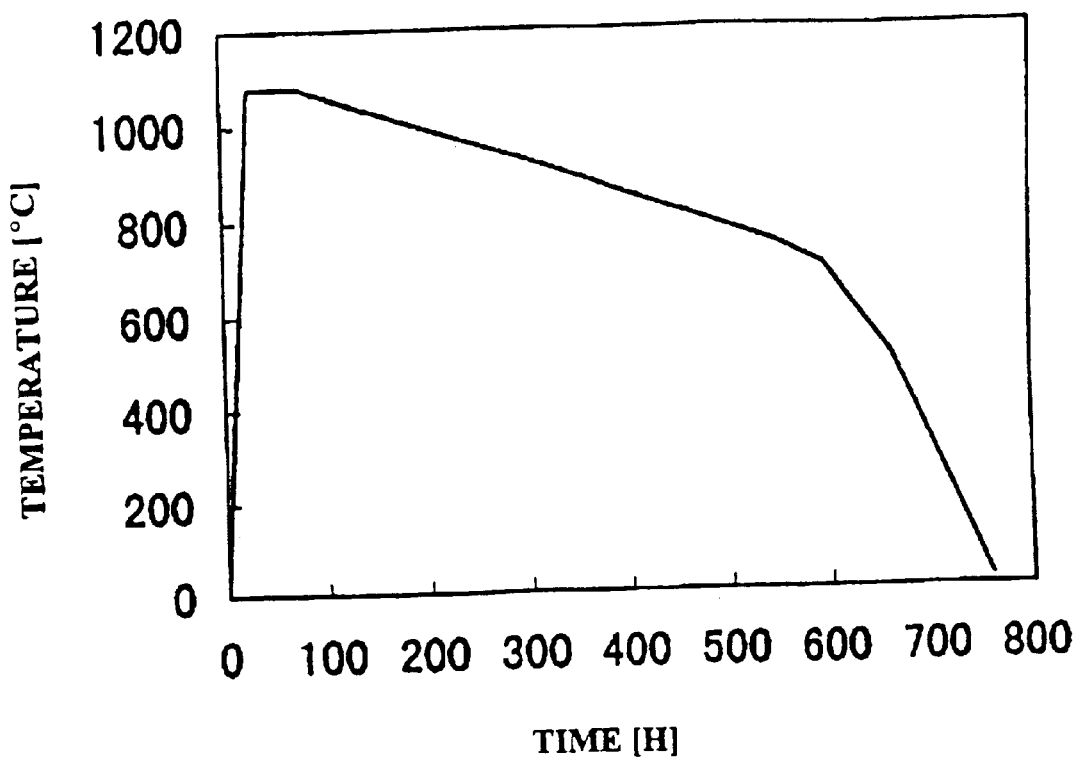
FIG. 5 is a temporal graph that shows the schedule of the annealing process in the fourth preferred embodiment.

Using the same device as in the third preferred embodiment, a single crystal of calcium fluoride with a large diameter (ø 230 mm or greater) having superior optical properties, which can be used for photolithography with a wavelength of 250 nm or less, was manufactured by annealing calcium fluoride with a size of ø 260 mm×60 mm, with the following schedule. As shown in FIG. 5, the entire process takes approximately 32 days.

TABLE 5

| Temperature schedule | Speed of temperature change | Required time |
| --- | --- | --- |
| 20 → 1080° C. | 40° C./h | 27 h |
| 1080 → 1080° C. | — | 48 h |
| 1080 → 750° C. | 0.7° C./h | 471 h |
| 750 to 700° C. | 1° C./h | 50 h |
| 700 → 500° C. | 3° C./h | 67 h |
| 500 → 20° C. | 5° C./h | 96 h |

In other words, with the manufacturing method of the present embodiment, the maximum temperature was set to be 1080° C. (first temperature in the range of 1020 to 1150° C.) and it was maintained for a designated period of time (48 hours). During the cooling process in the high temperature range from said first temperature to 750° C. (second temperature in the range of 600° C. to 800° C. or in the range of 700° C. to 900° C.), the cooling speed was set to be 0.7° C./h (1.2° C./h or less).

During the cooling process in the middle temperature range, from said second temperature to 500° C. (third temperature in the range of 400° C. to 500° C. or in the range of 500° C. to 600° C.), cooling was carried out at 1° C./h (3° C./h or less) from 750° C. to 700, and at 3° C./h (3° C./h or less) from 700° C. to 500° C. (two-stage cooling process). Then, during the cooling process in the low temperature range, from said third temperature to room temperature, the cooling speed was set to be 5° C./h (5° C./h or less).

The double refraction and the uniformity of the refractive index of the manufactured single crystal of calcium fluoride were measured. The maximum value of the double refraction (in the direction of the axis of light) was 1.9 nm/cm and the off-axis strain (double refraction in the off-axis direction) was 5 dm/cm. In addition, the uniformity of the refractive index was Δn=1.4E-6, and the RMS (root mean square) after spherical adjustment was 72E-4λ (λ=632.8 nm). It had highly superior optical properties, which can be used for photolithography with a wavelength of 250 nm or less (in particular, a wavelength of 200 nm or less).

In the present embodiment, because the cooling speed during the cooling process in the high temperature range has a particularly great effect on the improvement of the optical properties of the processed object (single crystal of calcium fluoride), cooling was conducted in the high temperature range with sufficient slowness. During the cooling process in the middle and low temperature ranges, which has less of such an effect, the cooling was accelerated when the temperature decreased. Therefore, a balance between the effect of improving the optical properties of the processed object (single crystal of calcium fluoride) and productivity was achieved.

Therefore, with the present embodiment, it is possible to obtain a single crystal of calcium fluoride with a uniform refractive index and a sufficiently small double refraction, which can be used for photolithography. Not only is it possible to obtain a single crystal of calcium fluoride with a large diameter (ø 230 mm or greater) having superior optical properties, which can be used in particular for photolithography with a wavelength of 250 nm or less, but also productivity can be adequately maintained In the present embodiment, the cooling process in the medium temperature range had two stages (750° C. to 700° C.: with a cooling speed of 1° C./h, 700° C. to 500° C.: with a cooling speed of 3° C./h). As described above, as the processed object (single crystal of calcium fluoride) becomes larger, it is desirable to change the cooling process in the high temperature and/or medium temperature range from a single stage (single cooling speed) to multiple stages (two or more cooling speeds). Namely, as the processed object (single crystal of calcium fluoride) becomes larger, it is preferable to subdivide the cooling process in the high temperature and/or medium temperature range (add one, or two or more cooling processes at a speed that is lower than a cooling speed in a single stage) to the extent that productivity can be sufficiently maintained. By having said structure, even if the processed object (single crystal of calcium fluoride) is further enlarged, not only is it possible to obtain a single crystal of calcium fluoride with a large diameter having superior optical properties that can be used for photolithography with a wavelength of 250 nm or less, but also productivity can be sufficiently maintained.

Second Comparative Example

Figure 6:
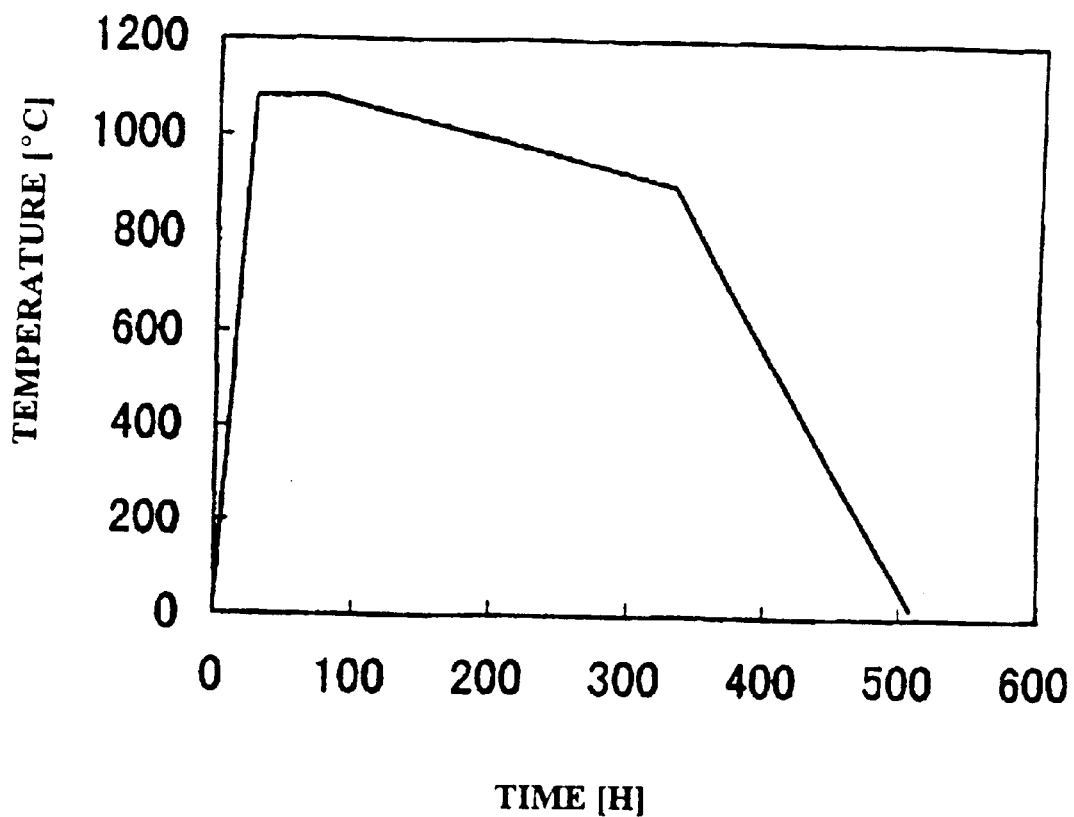
FIG. 6 is a temporal graph that shows the schedule of the annealing process of the second comparative example of the prior art.

Using the same device as in the third embodiment, a single crystal of calcium fluoride was manufactured by annealing calcium fluoride with a size of ø 240 mm×50 mm with the following schedule. As shown in FIG. 6., the entire process takes approximately 22 days.

TABLE 6

| Temperature schedule | Speed of temperature change | Required time |
| --- | --- | --- |
| 20 → 1080° C. | 40° C./h | 27 h |
| 1080 → 1080° C. | — | 48 h |
| 1080 → 900° C. | 0.7° C./h | 257 h |
| 900 → 20° C. | 5° C./h | 176 h |

In other words, in the manufacturing method of the present comparative example, the maximum temperature of the annealing was set to be 1080° C. and it was maintained for a designated period of time (48 hours). Then it was cooled at a speed of 0.7° C./h to 900° C. Then from 900° C. to room temperature, the cooling speed was set to be 5° C./h in order to have better productivity.

The double refraction and the uniformity of the refractive index of the manufactured single crystal of calcium fluoride was measured. The maximum value of the double refraction (in the direction of the axis of light) was 3.9 nm/cm and the off-axis strain (double refraction in, the off-axis direction) was 11 nm/cm. In addition, the uniformity of the refractive index was $\Delta n=3.1E-6$, and the RMS (root mean square) after the spherical adjustment was 227E-4$\lambda$ ($\lambda=632.8$ nm). Therefore, it did not possess optical properties that could be used for photolithography with a wavelength of 250 nm or less. Namely, in the present comparative example, during the cooling process in the high temperature range (1080 to 900° C.), which has a very large effect on the improvement of the optical properties of the processed object (single crystal of calcium fluoride) due to the cooling speed, cooling was carried out with sufficient slowness, however, the cooling after that (900° C. to 20° C.) was so fast that a single crystal of calcium fluoride with superior optical properties that could be used for photolithography with a wavelength of 250 nm or less could not be obtained.

As described above, with the present invention, a single crystal of calcium fluoride with superior uniformity of the refractive index and a sufficiently small double refraction, which can be used in an optical system for photolithography can be obtained. In particular, a single crystal of calcium fluoride with a large diameter (ø 230 mm or greater) having superior optical properties, which can be used for photolithography with a wavelength of 250 nm or less can be obtained. In addition, with the present invention, not only can a single crystal of calcium fluoride with a large diameter (ø 230 mm or greater) having superior optical properties be obtained, but also productivity can be sufficiently maintained.

With the present invention, calcium fluoride with a small double refraction, which has been impossible in the past for a large calcium fluoride of ø 230 mm or greater, can be obtained. Therefore, calcium fluoride that can be used in practice for photolithography (wavelength of 200 nm or less) can be supplied. In addition, the uniformity of the refractive index has reached a sufficient uniformity. The period of time required for the annealing process is 4 to 5 weeks. This period of time is not a problem for production, and costs can be maintained at a minimum.

It will be apparent to those skilled in the art that various modifications and variations can be made in the manufacturing method for calcium fluoride and calcium fluoride for photolithography of the present invention without departing from the spirit or scope of the invention. Thus, it is intended that the present invention cover the modifications and variations of this invention provided they come within the scope of the appended claims and their equivalents.

What is claimed is:

1. A single crystal of calcium fluoride for photolithography for using light having a wavelength of 250 nm or less, with a diameter of ø 200 mm or greater, with a double refraction value in the direction of the axis of light that is 2 nm/cm or less, and with a double refraction value in the off-axis direction perpendicular to the axis of light that is 5 nm/cm or less.

2. A single crystal of calcium fluoride according to claim 1, wherein a difference in a refractive index, $\Delta n$, is $2\times10^{-6}$ or less.

3. The single crystal of calcium fluoride according to claim 1, which was treated as follows:

heating said single crystal of calcium fluoride in a vacuum to a first temperature, which is between 1020° C. and 1150° C., said first temperature being lower than a melting point of said single crystal of calcium fluoride, maintaining said single crystal of calcium fluoride at the first temperature for a designated period of time, and lowering the temperature of said single crystal of calcium fluoride to room temperature.

4. The single crystal of calcium fluoride according to claim 3, wherein the lowering of the temperature comprises decreasing the temperature from said first temperature to room temperature at a rate of 2° C./hour or less.

5. The single crystal of calcium fluoride according to claim 3, wherein the lowering of the temperature comprises decreasing the temperature from said first temperature to a second temperature, which is in the range of around 600° C. to 900° C., at a rate of 2° C./hour or less.

6. The single crystal of calcium fluoride according to claim 5, wherein the lowering of the temperature comprises decreasing the temperature from said second temperature to room temperature at a rate of 5° C./hour or less.

7. A single crystal of calcium fluoride for photolithography for using light having a wavelength of 200 mn or less, with a diameter of ø 230 mm or greater, with a double refraction value in the direction of the axis of light that is 2 nm/cm or less, and with a double refraction value in the off-axis direction perpendicular to the axis of light that is 5 nm/cm or less.

8. A single crystal of calcium fluoride according to claim 7, wherein a difference in a refractive index, $\Delta n$, is $2\times10^{-6}$ or less.

9. The single crystal of calcium fluoride according to claim 7, which was treated as follows:

heating said single crystal of calcium fluoride in a vacuum to a first temperature, which is between 1020° C. to 1150° C., said first temperature being lower than a melting point of said single crystal of calcium fluoride, maintaining said single crystal of calcium fluoride at the first temperature for a designated period of time, and lowering the temperature of said single crystal of calcium fluoride to room temperature.

10. The single crystal of calcium fluoride according to claim 9, wherein the lowering of the temperature comprises decreasing the temperature from said first temperature to a second temperature, which is in the range of about 600° C. to 900° C., at a rate of 1.2° C./hour or less.

11. The single crystal of calcium fluoride according to claim 10, wherein the lowering of the temperature comprises decreasing the temperature from said second temperature to a third temperature, which is in the range of around 400° C. to 600° C., at a rate of 3° C./hour or less.

12. The single crystal of calcium fluoride according to claim 11, wherein the lowering of the temperature comprises decreasing the temperature from said third temperature to room temperature at a rate of 5° C./hour or less.

* * * * *